United States Patent
Bhat et al.

(10) Patent No.: US 11,940,724 B2
(45) Date of Patent: Mar. 26, 2024

(54) RETICLE PROCESSING SYSTEM

(71) Applicant: Applied Materials, Inc., Santa Clara, CA (US)

(72) Inventors: Sanjay Bhat, Singapore (SG); Vibhu Jindal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 701 days.

(21) Appl. No.: 17/110,514

(22) Filed: Dec. 3, 2020

(65) Prior Publication Data

US 2021/0173295 A1 Jun. 10, 2021

Related U.S. Application Data

(60) Provisional application No. 62/944,097, filed on Dec. 5, 2019.

(51) Int. Cl.
| | |
|---|---|
| *G03F 1/20* | (2012.01) |
| *G03F 7/00* | (2006.01) |
| *G03F 7/09* | (2006.01) |
| *G03F 9/00* | (2006.01) |

(52) U.S. Cl.
CPC ............... *G03F 1/20* (2013.01); *G03F 7/09* (2013.01); *G03F 7/70283* (2013.01); *G03F 7/70716* (2013.01); *G03F 7/70741* (2013.01); *G03F 9/7096* (2013.01)

(58) Field of Classification Search
CPC ............... G03F 9/7096; G03F 7/70283; G03F 7/70716; G03F 7/09; G03F 1/66; G03F 1/20; G03F 1/24; B65D 85/48; B65D 85/38; B65D 25/14; B65D 25/108; B65D 25/10; H01L 21/67353; H01L 21/67259; H01L 21/67373; H01L 21/67346; H01L 21/67386; H01L 21/68707; H01L 21/67359; H01L 21/681; H01L 21/67383; H01L 21/68785; H01L 21/683
See application file for complete search history.

(56) References Cited

U.S. PATENT DOCUMENTS

| | | | |
|---|---|---|---|
| 4,624,557 A | 11/1986 | Winn | |
| 6,005,910 A | 12/1999 | Chiba et al. | |
| 6,216,873 B1 * | 4/2001 | Fosnight | G03F 1/66 |
| | | | 206/454 |

(Continued)

FOREIGN PATENT DOCUMENTS

| | | |
|---|---|---|
| KR | 2004079536 | 9/2004 |
| KR | 20150053684 A | 5/2015 |
| WO | 2015023606 A1 | 2/2015 |

OTHER PUBLICATIONS

PCT International Search Report and Written Opinion in PCT/US2017/029585 dated Aug. 3, 2017, 14 pages.

(Continued)

*Primary Examiner* — Glenn F Myers
(74) *Attorney, Agent, or Firm* — Servilla Whitney LLC

(57) ABSTRACT

Provided herein are apparatus, systems and methods for processing reticle blanks. A reticle processing system includes a support assembly having a plate coupled to a frame, and a carrier base assembly supported on the support assembly. The carrier base assembly comprises a wall extending from a top surface of the carrier base and defining a containment region for a reticle.

16 Claims, 10 Drawing Sheets

(56) References Cited

U.S. PATENT DOCUMENTS

| | | | |
|---|---|---|---|
| 6,862,817 B1 | 3/2005 | Lenox | |
| 7,453,549 B2 | 11/2008 | Susuki et al. | |
| 9,919,863 B2 | 3/2018 | Lystad et al. | |
| 9,958,772 B1 * | 5/2018 | Hsueh | H01L 21/67366 |
| 2003/0058424 A1 | 3/2003 | Ramamoorthy et al. | |
| 2014/0321958 A1 | 10/2014 | Gambe | |
| 2016/0161869 A1 * | 6/2016 | Avneri | H01L 21/67775 |
| | | | 355/72 |
| 2017/0315437 A1 * | 11/2017 | Strassner | H01L 21/68785 |
| 2017/0342541 A1 * | 11/2017 | Bangert | H01L 21/67346 |
| 2019/0101821 A1 | 4/2019 | Hsu et al. | |
| 2019/0163070 A1 | 5/2019 | Shang et al. | |
| 2019/0206715 A1 * | 7/2019 | Yoshida | H01L 21/6838 |
| 2020/0211876 A1 * | 7/2020 | Raschke | G03F 1/66 |

OTHER PUBLICATIONS

PCT International Search Report and Written Opinion in PCT/US2020/063232 dated Mar. 29, 2021, 10 pages.

\* cited by examiner

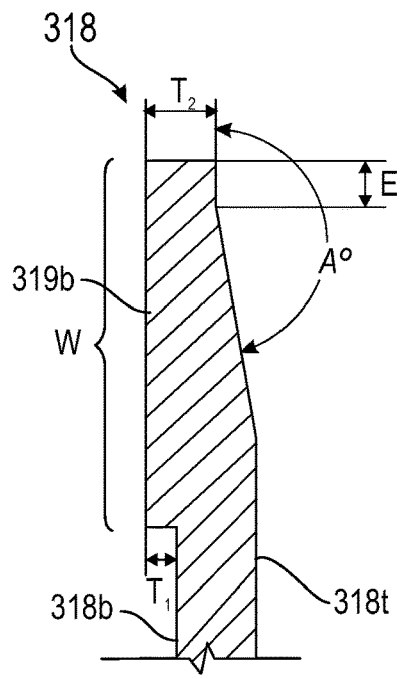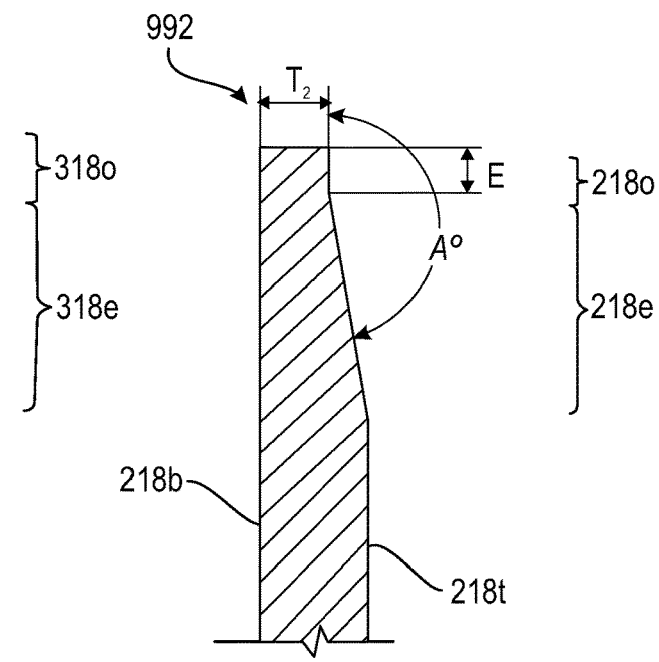
FIG. 12A
**FIG. 12B
(PRIOR ART)**
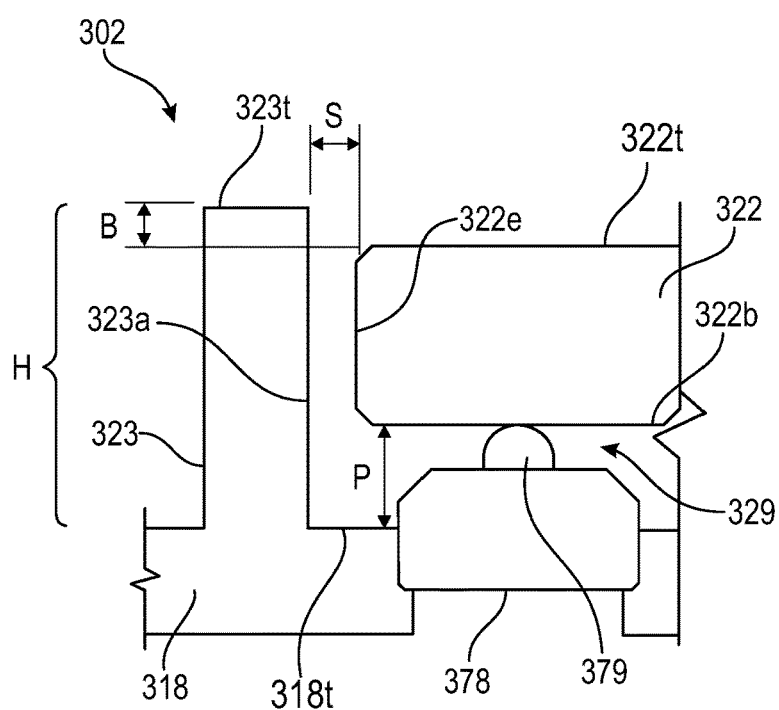
FIG. 13

RETICLE PROCESSING SYSTEM

CROSS-REFERENCE TO RELATED APPLICATIONS

The present disclosure claims priority to U.S. provisional application Ser. No. 62/944,097, filed on Dec. 5, 2019, the entire content of which is incorporated herein by reference.

TECHNICAL FIELD

Embodiments of the present disclosure relate generally to lithography mask blank processing and, more specifically, to a reticle processing system and associated methods for processing lithography mask blanks using the reticle handling system.

BACKGROUND

Extreme ultraviolet lithography (EUV), also known as soft x-ray projection lithography, has begun to replace deep ultraviolet lithography for the manufacture of 0.13 micron, and smaller, minimum feature size semiconductor devices. EUV systems operate by reflection instead of transmission of light. Through the use of a series of mirrors, or lens elements, and a reflective element, or a mask blank, coated with a non-reflective absorber mask pattern, patterned actinic light is reflected onto a resist-coated semiconductor wafer.

Conventional EUV mask blank processes may include, for example, a 152 mm×152 mm blank reticle being placed into various processing chambers to apply various material layers. As configured, the square reticle is sandwiched within a carrier assembly (e.g., a 300 mm carrier assembly) to enable the reticle to be transferred through an EUV mask blank production system like a 300 mm wafer. The carrier assembly may include a carrier base, the reticle blank, and a carrier top shield.

During processing, every time the reticle blank is transported into the EUV mask blank production system, the elements of the carrier assembly are brought together and separated apart. This process involves multiple lifts and clamps for separating the carrier base and the carrier top shield so a reticle can be placed therebetween. The lifts can be extended or retracted to open or close the carrier assembly. The carrier top shield is used on top of carrier base assembly to prevent deposition of material on the carrier base. Controlling the defects during handling of the mask blank is quite challenging. In addition, a carrier base is typically comprised of a machined aluminum piece, and it is difficult to provide a carrier base having zero flatness. When the carrier base sits on a pedestal of a deposition chamber having a flatness of 0.001", the carrier base contacts pedestal high point and slips during rotation of the pedestal, generating particles.

A carrier base also has multiple pockets required for camera inspection to align the carrier base and the carrier top shield. Pockets are also required for detecting the carrier top shield, machining, mounting pads and resting pins, which are potential source for passage of particles generated during slippage of the carrier base on a pedestal in a processing chamber. A carrier top shield mounted at higher level than the reticle is yet another potential source of particle falling on the substrate after deposition of a material layer on the reticle, which can lead to edge roll effect causing non uniform deposition on the reticle. Improved handling systems for EUV mask blanks and reticles to address one or more of these problems are needed.

SUMMARY

A first embodiment pertains to a reticle processing system comprising a support assembly including a plate coupled to a frame; and a carrier base assembly configured to be positioned on the support assembly, the carrier base assembly comprising a carrier base comprising top surface and a wall extending from the carrier base defining a containment region, the containment region sized and shaped to contain an EUV reticle.

A second embodiment pertains to a carrier base assembly comprising a carrier base comprising top surface and a wall extending from carrier base defining a containment region, the containment region sized and shaped to contain an EUV reticle; and an EUV reticle contained within the containment region.

An exemplary method embodiment pertains to a method of processing an EUV reticle blank, the method comprising providing a carrier base assembly including a carrier base and a reticle blank, the carrier base comprising top surface and a wall extending from carrier base defining a containment region, the containment region sized and shaped to contain the EUV reticle; placing the carrier base atop a support assembly, the support assembly including a plate coupled to a frame; depositing the reticle blank within containment region of the carrier base; and removing the carrier base assembly from the support assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate embodiments of this disclosure and are therefore not to be considered limiting of its scope, for the disclosure may admit to other equally effective embodiments. The drawings are not necessarily to scale. The drawings are merely representations, not intended to portray specific parameters of the disclosure. Furthermore, the drawings are intended to depict exemplary embodiments of the disclosure, and therefore, are not considered as limiting in scope.

FIG. 12A is a detailed view of an edge portion of a carrier base according to an embodiment of the disclosure;

FIG. 12B is a detailed view of an edge portion of a prior art carrier base;

FIG. 13 is a detailed view of an end of a carrier base assembly showing an edge of the reticle adjacent the wall of the carrier base according to an embodiment of the disclosure;

DETAILED DESCRIPTION

Various embodiments in accordance with the present disclosure will now be described more fully hereinafter with reference to the accompanying drawings. The workpiece aligner apparatus and methods described herein may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

As stated above, provide herein are approaches for processing reticle blanks. In one approach, a reticle processing system includes a support assembly having a plate coupled to a frame, and a carrier assembly coupled to the support assembly. The reticle processing system described herein may reside in a "clean" laminar flow region of a mini-environment instead of, for example, a stand-alone pod having no laminar flow and occupying one of the load port positions. In one approach, the carrier assembly includes a carrier base coupled to the plate, a reticle disposed over the carrier base, and a carrier top shield disposed over the reticle, wherein the carrier top shield has a central opening formed therein, providing ingress/egress for the reticle. In one approach, when the carrier assembly is placed atop the support assembly, a plurality of pins extend from the plate through corresponding openings in the carrier base, the plurality of pins supporting the carrier assembly so the carrier base, the reticle, and the carrier top shield are each independently supported and vertically separated from one another.

Figure 1:
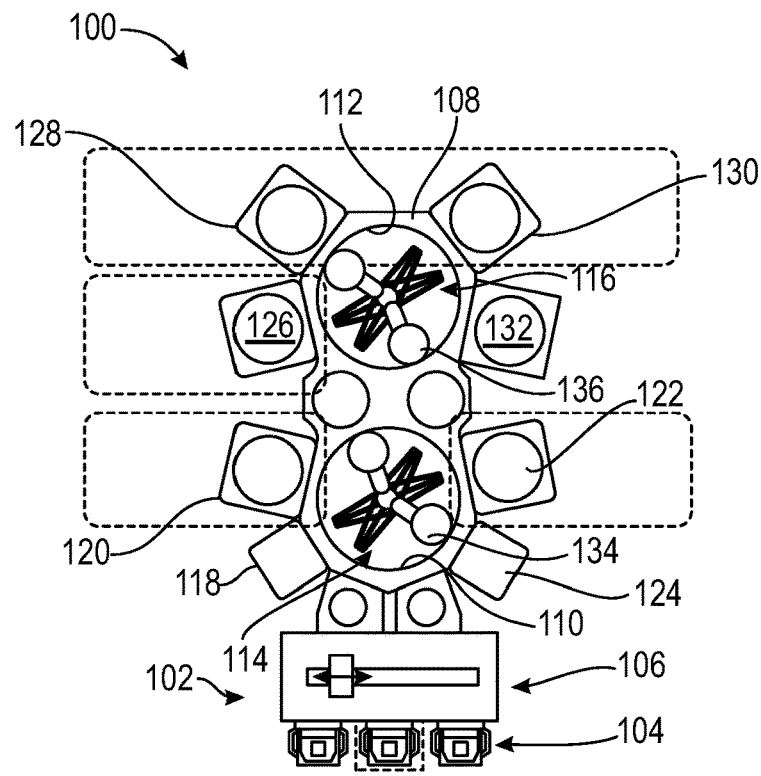
FIG. 1 shows a schematic of an exemplary extreme ultraviolet mask production system in accordance with certain aspects of the present disclosure.

With reference now to the figures, FIG. 1 depicts an EUV mask blank production system 100. The EUV mask production system 100 may include a mask blank loading and carrier handling system 102 receiving one or more mask blanks 104. An airlock 106 provides access to a wafer handling vacuum chamber 108. In the embodiment shown, the wafer handling vacuum chamber 108 contains two vacuum chambers, e.g., a first vacuum chamber 110 and a second vacuum chamber 112. Within the first vacuum chamber 110 is a first wafer handling system 114, and in the second vacuum chamber 112 is a second wafer handling system 116.

In one or more embodiments, the wafer handling vacuum chamber 108 has a plurality of ports around its periphery for attachment of various other systems. In this non-limiting embodiment, the first vacuum chamber 110 has a degas system 118, a first physical vapor deposition system 120, a second physical vapor deposition system 122, and a pre-clean system 124. Furthermore, the second vacuum chamber 112 is shown as including a first multi-cathode source 126, a flowable chemical vapor deposition (FCVD) system 128, a cure system 130, and a second multi-cathode source 132 connected to it.

The first wafer handling system 114 is configured to move wafers, such as a wafer 134, among the airlock 106 and the various systems around the periphery of the first vacuum chamber 110 and through slit valves in a continuous vacuum. The second wafer handling system 116 is configured to move wafers, such as a wafer 136, around the second vacuum chamber 112, while maintaining the wafers in a continuous vacuum. The integrated EUV mask production system 100 may operate with a reticle processing system described below.

Figure 2:
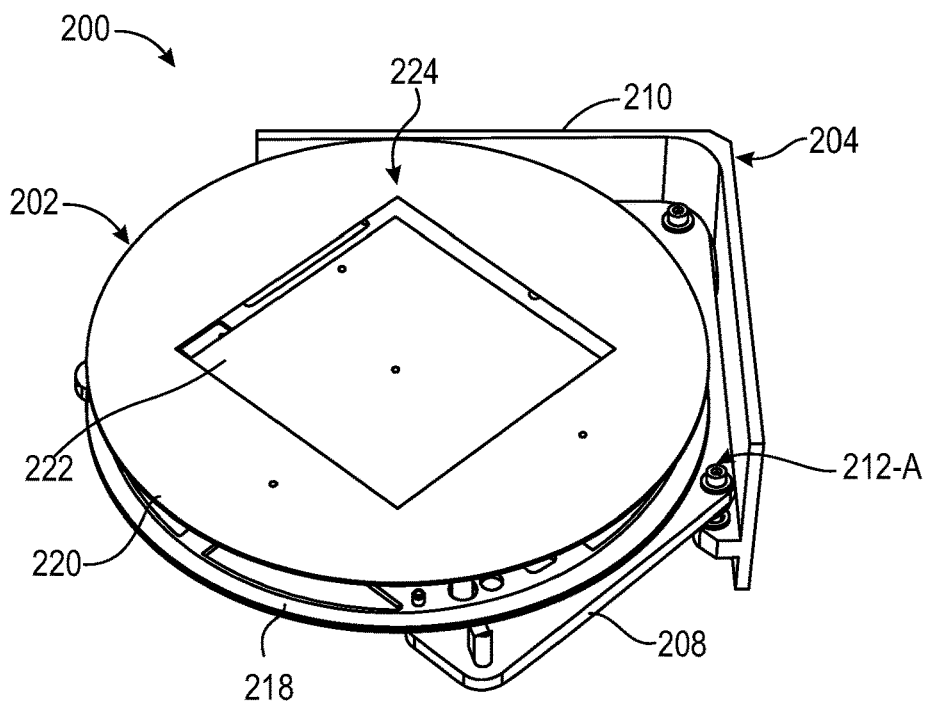
FIG. 2 is a perspective view of a prior art reticle processing system.
Figure 3:
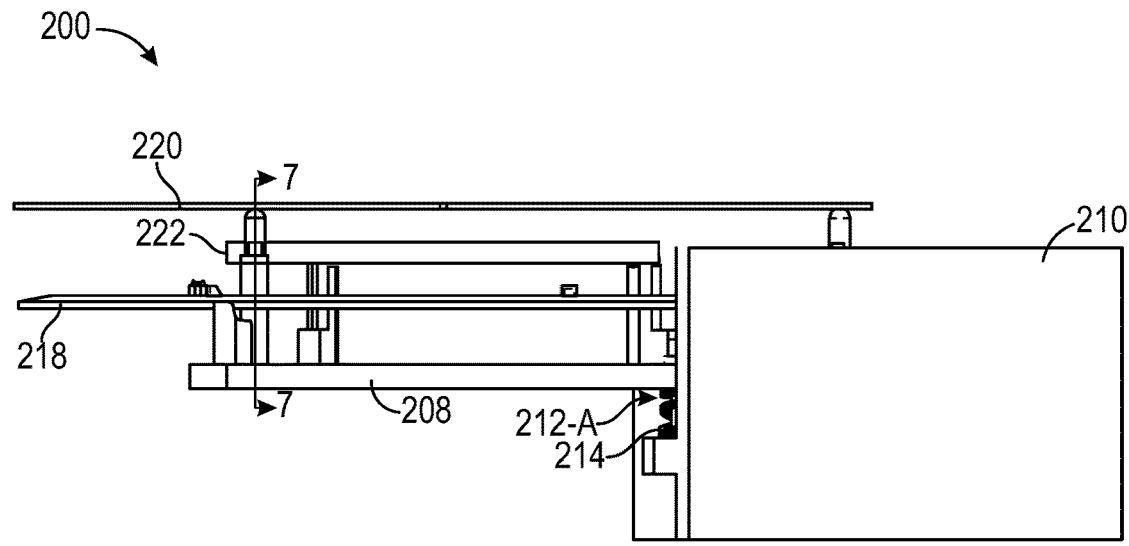
FIG. 3 is a side view of the reticle processing system of FIG. 2.
Figure 4:
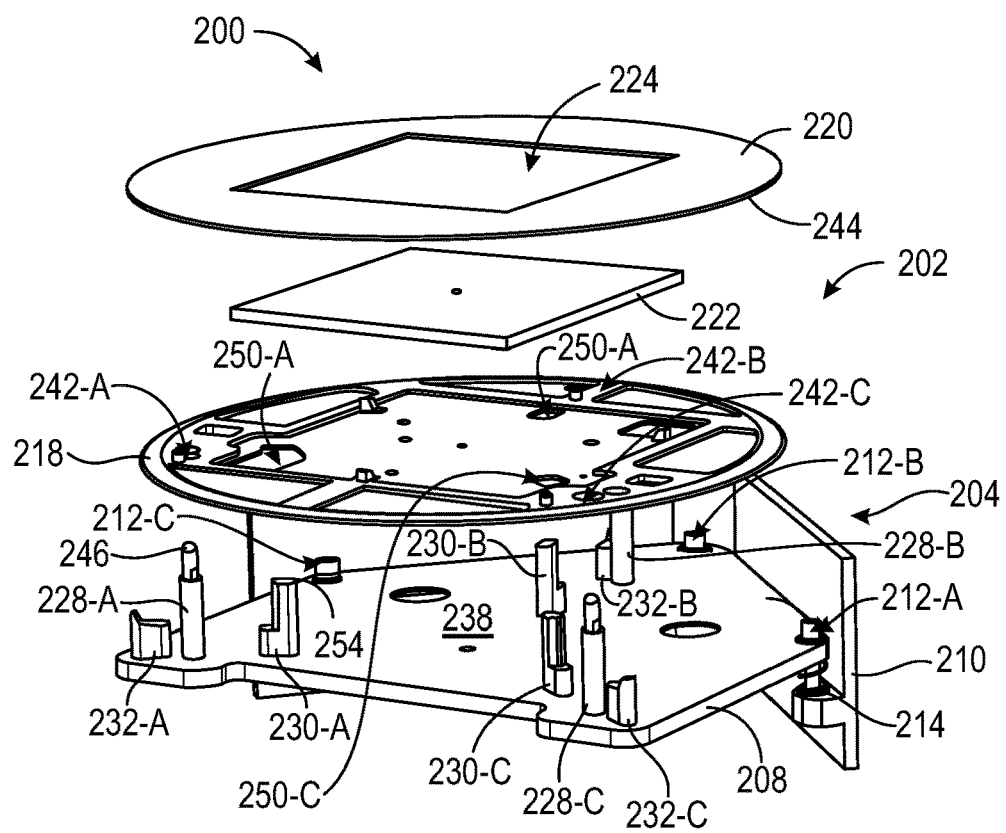
FIG. 4 is an exploded perspective view of the reticle processing system of FIG. 2.

Referring to FIGS. 2-4, a prior art reticle processing system 200 in use with a prior art carrier base 218 is shown. As shown, the reticle processing system 200 (hereinafter "system") includes a carrier assembly 202 coupled to and supported by a support assembly 204. The support assembly 204 includes a plate 208 coupled to a frame 210 extending partially along a periphery of the plate 208. As shown, the plate 208 is coupled to the frame 210 by a set of fasteners 212A-C extending through openings of the frame 210. Although not limited to any particular type, the fasteners 212A-C may include nuts and bolts extending through the plate 208 and the frame 210, wherein a spring 214 is provided around the bolt to provide flexibility/resiliency to the fasteners 212A-C. As shown, the frame 210 has an L-shaped configuration and the plate 208 a hexagonal shape, thus permitting the support assembly 204 to be secured to a corner within a processing chamber. This configuration is non-limiting, as other geometries for the frame 210 and the plate 208 may be possible depending on the specific application and processing environment.

As shown, the carrier assembly 202 includes a prior art carrier base 218 and a carrier top shield 220 respectively disposed below and above a reticle blank 222. The carrier top shield 220 includes a central opening 224 formed therein to permit access to and ingress/egress of the reticle blank 222 during processing. As shown, the central opening 224 of the carrier top shield 220 is generally aligned over the reticle blank 222. In one non-limiting approach, the reticle blank 222 is an EUV mask blank having an ultra-low thermal expansion substrate of glass, silicon, or other ultra-low thermal expansion material. The ultra-low thermal expansion materials may include fused silica, fused quartz, calcium fluoride, silicon carbide, silicon oxide-titanium oxide alloy, or other material having a thermal coefficient of expansion within the range of these materials.

As shown in FIGS. 4-7, the plate 208 of the prior art system 200 includes a first set of pins 228A-C, a second set of pins 230A-C, and a third set of pins 232A-C, each extending vertically, or generally vertically, from a top surface 234 of the plate 208. The second set of pins 230A-C is positioned closer to a center section 238 of the plate 208 than the first set of pins 228A-C, and the first set of pins 228A-C is positioned closer to the center section 238 of the plate 208 than the third set of pins 232A-C. Each of the first, second, and third sets of pins 228A-C, 230A-C, and 232A-C are arranged in a triangular pattern for supporting each component of the carrier assembly 202, while minimizing the number of contact points between the plurality of pins and the carrier assembly.

Figure 5:
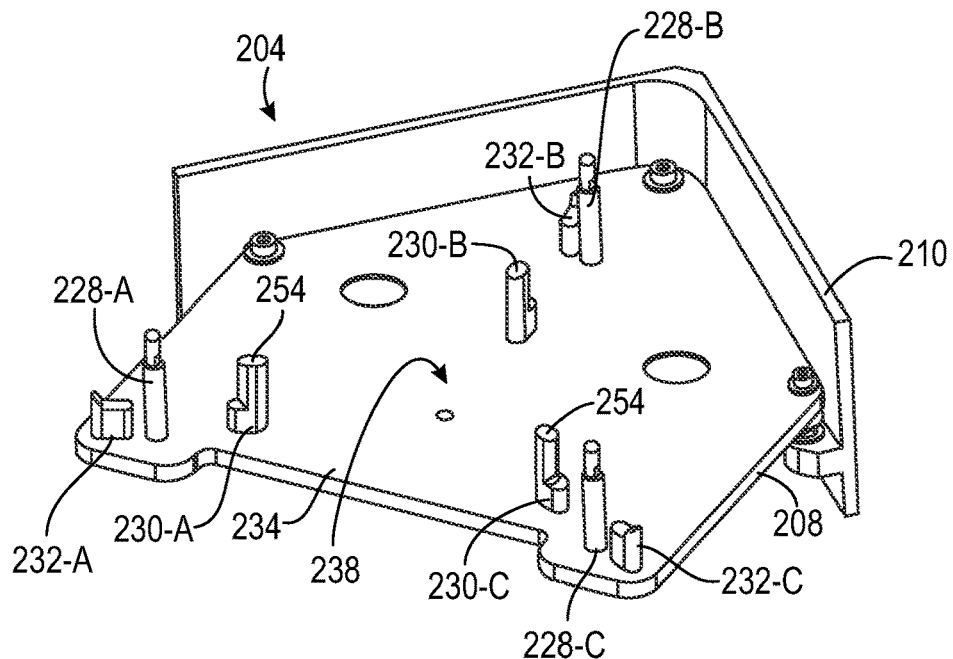
FIG. 5 is a perspective view of a prior art support assembly of the reticle processing system of FIG. 2.
Figure 6:
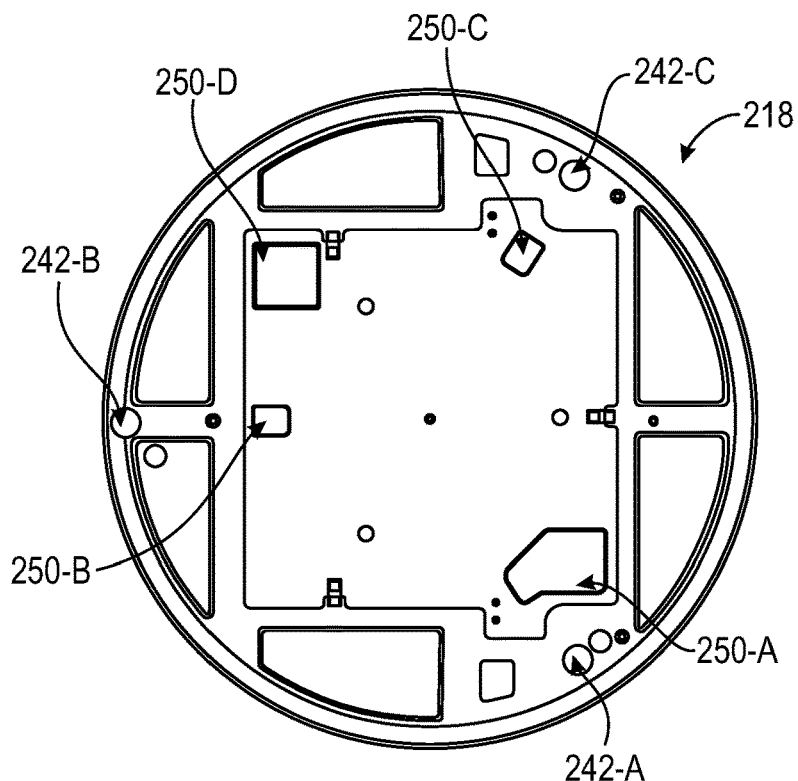
FIG. 6 is a top view of a carrier base of the reticle processing system of FIG. 2.
Figure 7:
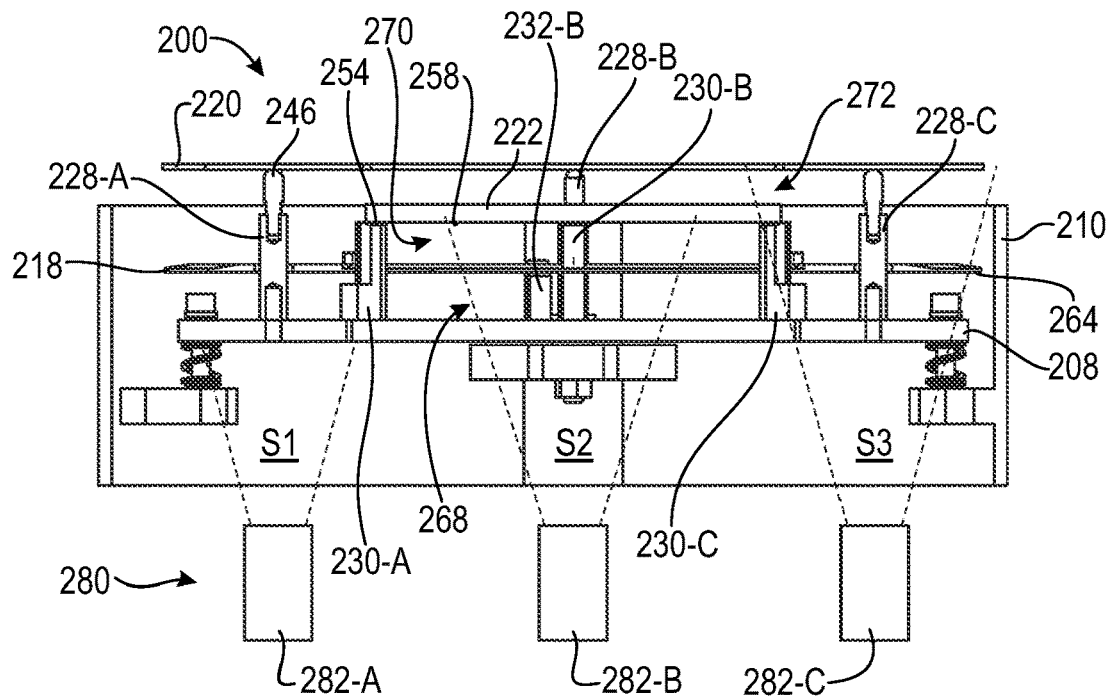
FIG. 7 is a side cross-sectional view of the reticle processing system of FIG. 2.

Referring now to FIGS. 5-7, during operation, the support assembly 204 receives the carrier assembly thereupon. More specifically, the prior art carrier base 218 is lowered onto the plate 208 causing the first set of pins 228A-C to extend through a corresponding first set of openings 242A-C within the prior art carrier base 218. As shown, the first set of pins 228A-C generally extend vertically higher than the second and third set of pins 230A-C and 232A-C so as to come into contact with a bottom surface 244 of the carrier top shield 220 once assembled. The first set of pins 228A-C support and elevate the carrier top shield 220 over the reticle 222. The first set of pins 228A-C each includes a domed upper tip 246 for minimally engaging the bottom surface 244 of the carrier top shield 220.

Furthermore, as the prior art carrier base 218 is lowered on the plate 208, the second set of pins 230A-C extend through a corresponding second set of openings 250A-C within the carrier base and engage the reticle 222. The openings 250A and 250D are camera inspection openings. As shown, the second set of pins 230A-C generally extend vertically higher than the third set of pins 232A-C, yet not as high as the first set of pins 228A-C. Each of the second set of pins 230A-C includes an upper face 254 engaging a bottom surface 258 of the reticle 222 to support the reticle over the carrier base 218. The upper face 254 slopes downward towards the center section 238 of the plate 208.

Referring back to FIG. 7, the plurality of pins 228A-C, 230A-C, and 232A-C support the carrier assembly 202 so the prior art carrier base 218 at a bottom surface 264 thereof, the reticle 222, and the carrier top shield 220 are each independently supported and vertically separated from one another. During use, when the carrier assembly 202 is placed on the support assembly 204, the components of the carrier assembly are not in direct contact with one another. Specifically, the plurality of pins support the components of the carrier assembly 202 in a way so the carrier base 218 is vertically separated from the plate 208 by a first gap 268, the reticle 222 is vertically separated from the carrier base 218 by a second gap 270, and the carrier top shield 220 is separated from the reticle 222 by a third gap 272. The placement and relative heights of the plurality of pins 228A-C, 230A-C, and 232A-C, as well as the corresponding openings through the carrier base 218, enable the demonstrated separation between components of the carrier assembly 202 when positioned atop the support assembly 204.

As further shown in FIG. 7, the prior art system 200 may include a sensor system 280 for aligning the carrier assembly 202 to the support assembly 204. For example, one or more sensors 282A-C is used to verify whether each of the carrier assembly components (e.g., the carrier top shield 220, the reticle 222, or the carrier base 218) is correctly "in-position" on the support assembly 204. This also prevents a user from inadvertently placing the carrier assembly 202 or reticle 222 on the support assembly 204 if one is already in position.

As shown in FIG. 7, a first sensor 282-A monitors a first scan area S1 for detecting a presence and placement of the carrier base 218, a second sensor 282-B monitors a second scan area S2 for detecting a presence and placement of the reticle 222, and a third sensor 282-C monitors a third scan area S3 for detecting a presence and placement of the carrier top shield 220. The sensors may transmit an output/feedback to a processor (not shown) of the sensor system 280 for subsequent analysis/processing.

During operation, the sensor system 280 is used in conjunction with a robot (not shown), such as a factory interface (FI) robot, to accurately place the carrier assembly 202, including the reticle 222, onto the support assembly 204, where the carrier assembly 202 can be assembled or disassembled. Furthermore, the sensor system 280 is used to verify the carrier assembly 202, including the reticle 222, are assembled correctly prior to being delivered to the loadlock. Advantageously, the robot is the sole moving component, ensuring the system 200 is not subject to unnecessary lifts or multiple robots, thus minimizing positional errors. For example, the vertical pick up and drop off trajectory of the robot is virtually identical, unlike when multiple, different lifts are employed.

Figure 8:
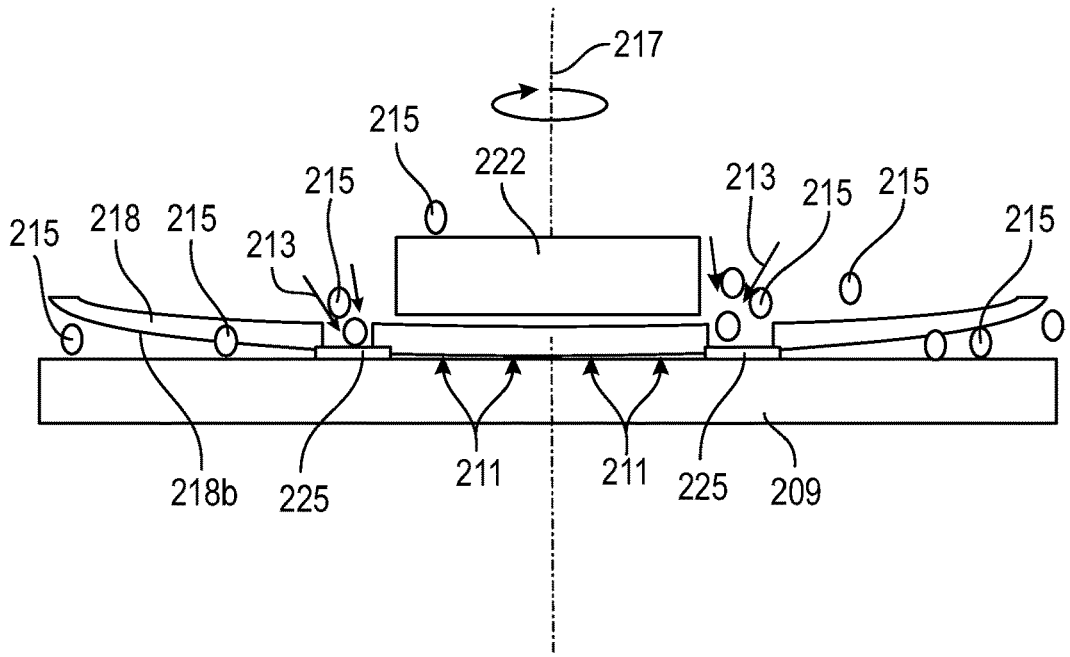
FIG. 8 is a schematic view of a reticle on a prior art carrier base.

As discussed above, and with reference to FIG. 8, which is a schematic view of a prior art carrier base 218 on a rotating pedestal 209 rotating about axis 217. It is very difficult to obtain flatness across the bottom surface 218b of the prior art carrier base 218, which results and friction (represented by arrows 211) between the pedestal and the bottom surface 218b of the carrier base 218 causing generation of particles 215 from deposited material 225 deposited in the gaps shown by arrows 213. The prior art carrier base 218 has multiple gaps and openings (e.g., openings 242A-C and openings 250A-D) which are source of migration of particles 215 from the pedestal 209 to top of the reticle 222 through these openings as shown by the arrows 213.

Figure 9:
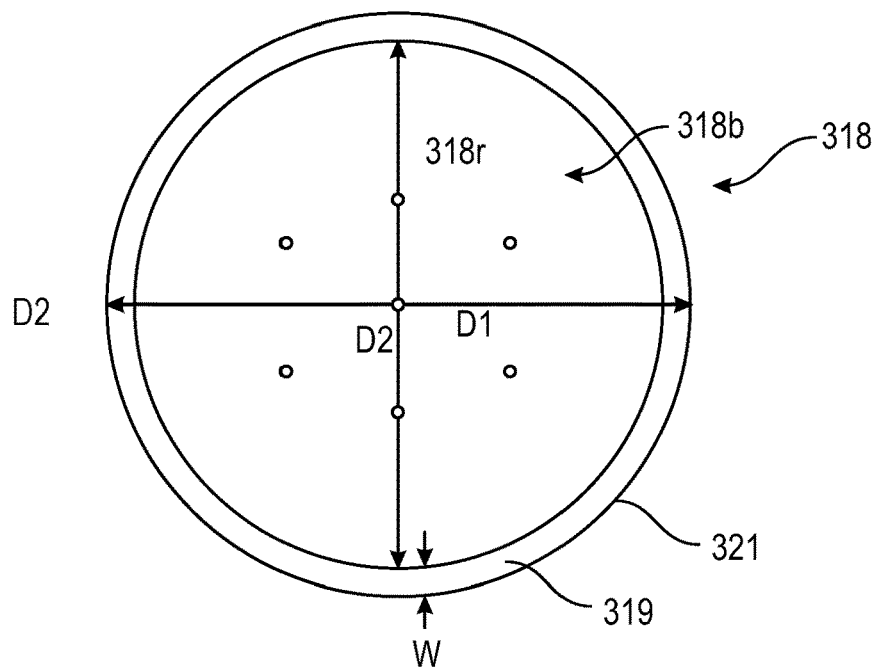
FIG. 9 is a bottom plan view of a carrier base according to an embodiment of the disclosure.

Referring now to FIG. 9, a top plan view of a carrier base 318 according to one or more embodiments comprises a bottom surface 318b is shown as including a peripheral rim 319, which provides relief or a gap between the region 318r bounded by the peripheral rim 319 and which avoids friction between the surface of pedestal and the carrier base 318. The peripheral rim 319 defines a peripheral edge 321, and the carrier base 318 has an overall diameter D1. The peripheral rim 319 has a width W, and the region 318r bounded by the peripheral rim has a diameter D2. Thus, the width W is the difference between D1 and D2 so that D1−D2=W.

Figure 10:
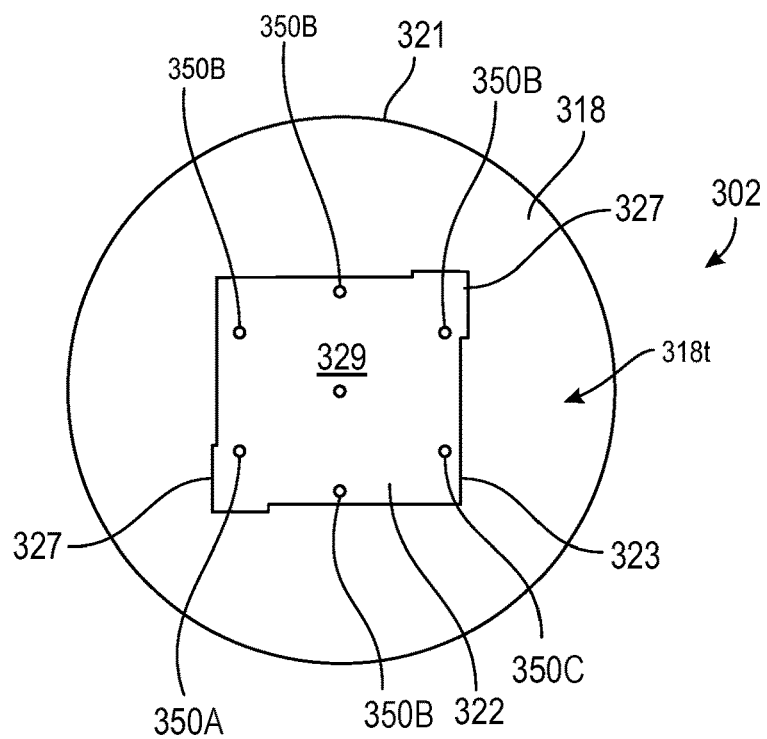
FIG. 10 is a top plan view of a carrier base assembly showing the carrier base of FIG. 9 and a reticle atop the carrier base.
Figure 11:
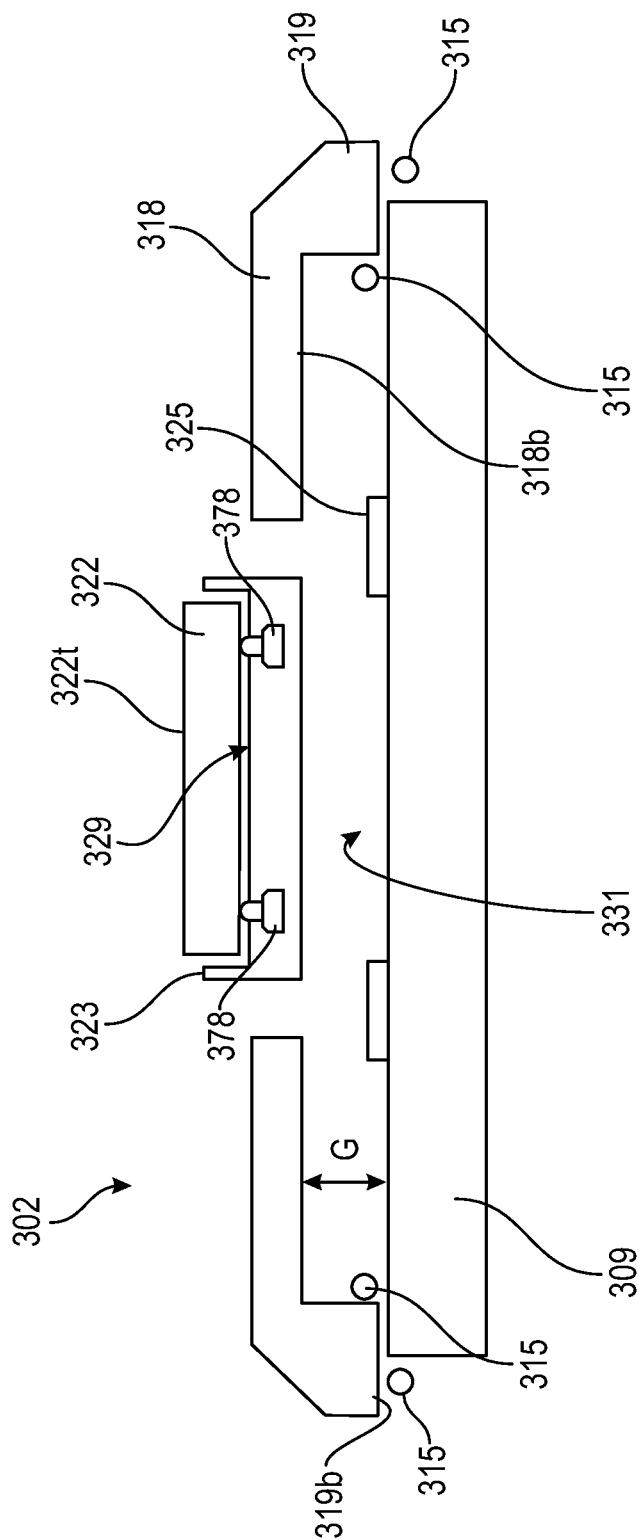
FIG. 11 is a side view of the carrier base assembly of FIG. 10.

FIG. 10 is a bottom plan view of a carrier base assembly 302 comprising the carrier base 318 of FIG. 9 and a reticle 322 mounted on top surface 318t of the carrier base 318. A wall 323 extending from the carrier base top surface 318t forms a containment region 329 to hold the reticle 322 on the top surface 318t of the carrier base 318. As best shown in FIG. 11, contact between the bottom surface 318b of the carrier base 318 in the region 318r bounded by the peripheral rim 319 and the pedestal is avoided and a gap G (or relief) is provided between the bottom surface 318b of the carrier base 318 and the pedestal 309 in the region 318r. The region 318r of the carrier base 318 may be referred to as the central region of the carrier base 318. The only contact between the carrier base 318 and the pedestal 309 is at the rim 319 bottom surface 319b at the outer periphery of the carrier base 318. In the event that there is relative motion causing friction between the bottom surfaces 319b, any particles generated by are far away from the quality blank area. The peripheral rim can have a thickness $T_1$ in a range of from 0.005 inches to 0.100 inches (0.127 mm to 2.54 mm), from 0.010 inches to 0.090 inches (0.254 mm to 2.29 mm), from 0.010 inches to 0.080 inches (0.254 mm to 2.03 mm), or from 0.010 to 0.070 (0.254 mm to 1.78 mm) inches or from 0.010 inches to 0.060 inches (0.254 mm to 1.52 mm). According to one or more embodiments, the thickness $T_1$ is configured to provide a gap G that reduces particle accumulation on a reticle held by the carrier base 318 during a physical vapor deposition process when the carrier base 318 holding the reticle 322 is placed on a pedestal 309 of a physical vapor deposition process chamber. In one or more embodiments, the area 331 under the reticle 322, which in some embodiments is referred to a quality reticle area, is free from particles 315 during a physical vapor deposition process which might be generated by deposited material 325 and friction between the carrier base 318 and the pedestal 309.

FIG. 12A shows details on the bottom surface 319b of the carrier base rim 319 compared with a prior art design shown in FIG. 12B. As shown in FIG. 12A, the rim has a width W, and a thickness $T_1$ defined by the distance from bottom surface 318b of the carrier base 318 central region and bottom surface 319b of the rim. The carrier base 318 has an overall thickness $T_2$ at flat outer edge 318o having a dimension E. A top edge tapered portion 318e tapers from top surface 318t of the carrier base 318. An angle A is formed between tapered edge portion 318e and flat outer edge 318O. The angle A is in a range of from 160 degrees to 180 degrees, for example 170 degrees or 175 degrees. Compared with the prior art carrier base 218, comprising bottom surface 218b, top edge 218t having a dimension E, flat outer edge 218o and tapered edge 218e defining an angle A. As can be seen from a comparison of FIG. 12A according to one or more embodiments of the disclosure with FIG. 12B, there is not a peripheral rim in FIG. 12B defining a thickness $T_1$ defined by the distance from bottom surface 318b. The carrier base 218 has an overall thickness $T_2$ at flat outer edge 2180. The bottom surface 218b in FIG. 12B is flat, and when the bottom surface 218b is placed on a pedestal, there is no gap G defined by thickness $T_1$ as shown in FIG. 11.

FIG. 13 shows an enlarged partial side view of the carrier base wall 323 extending from the top surface 318t thereof. The carrier base wall has an overall height H and a top surface 323t. As shown in FIG. 13, when the reticle 322 is placed in containment region 329, edge 322e of the reticle 322 is spaced a distance S from an inner wall surface 323a of the wall 323 facing the reticle edge 322e. In addition, when the reticle is placed on the top surface 318t of the carrier base 318, and when the reticle 322 is resting on pins during a deposition process, the top surface 322t of the reticle 322 is lower than the top surface 323t of the wall 323. The top surface 322t of the reticle 322 is below the top surface 323t of the wall 323 by a distance B. Only one resting pin 378 having a domed surface 379 is shown in the partial view of FIG. 13. However, a plurality of resting pins 378 having domed surfaces 379 can be utilized according to one or more embodiments. In one or more embodiments, there are two resting pins 378, three resting pins 378, four resting pins 378, five resting pins 378 or more than five resting pins 378. Experiments were conducted to optimize spacing S between the edge 322e of the reticle and the wall surface 323a, height H of the wall and the distance B that the wall 323 top surface 323t extends beyond the top surface 322t of the reticle 322 to reduce deposition of material on the wall surface 323a of the carrier base wall 323, to achieve more uniform deposition on the reticle, and reduce particle generation on the reticle. In some embodiments, the spacing S is in a range of from 0.5 mm to 1 mm, and the distance B is in a range of from −1 mm to about 1 mm. It will be understood that when the distance B is a negative value, the top surface 323t is below the top surface 322t of the reticle. In some embodiments, the distance B is in a range of from 0.01 mm to 1 mm.

The carrier base 318 of one or more embodiments comprising the wall 323 extending from the top surface 318t does not require the carrier base assembly 302 to utilize a top shield as shown in FIGS. 2-4 and 7 during a deposition process Elimination of the top shield, which in prior art designs and as shown in FIG. 4 is placed above the surface of the reticle 322, eliminates another source of particle generation. The top shield also tends to create non-uniform deposition due to an edge roll effect of material rolling from the edges of the top shield during deposition onto the reticle during a deposition process in a physical vapor deposition chamber. Thus, according to one or more embodiments of the disclosure, a carrier base assembly configured to hold an EUV reticle during a physical vapor deposition process consists essentially of, and in some embodiments consists of the carrier base comprising a wall extending from the top surface of carrier base. In specific embodiments, the carrier base assembly does not include a top shield resting on the top surface 318t of the carrier base 318 and surrounding the reticle.

According to one or more embodiments, each of the resting pins 378 having the domed surfaces 379 which contacts the reticle 322 bottom surface 322b are configured to be press fit on the carrier base 318 so that each resting pin 378 domed surface 379 protrudes at a substantially equal distance P above the top surface 318t of the carrier base 318. Thus, according to some embodiments, the carrier base 318 includes a plurality of resting pins 378 each resting pin 378 having a domed surface 379, each of the resting pins 378 being spaced apart and configured so that the reticle 322 is substantially parallel with the carrier base top surface 318t. Maintaining the reticle 322 substantially parallel with the top surface 318t is important to control uniformity and roughness of the deposition during a physical vapor deposition process. According to some embodiments, when the reticle 322 is substantially parallel to the top surface 318t of the carrier base 318, there is less than 0.2 degrees of tilt of the reticle relative to a horizontal plane.

According to one or more embodiments, the carrier base 318 was redesigned to minimize and eliminate the openings in the prior art carrier base 218 shown in FIG. 6. It was determined that large openings and pockets provided sources of particle migration. Holes and pockets on prior art carrier base, which were source of particle migration to the reticle were eliminated or reduced in size. Instead of the large, open camera inspection openings 250A and 250D that had a substantially rectangular opening, smaller L-shaped camera pockets 327 (shown in FIG. 10) are present on opposite corners of the wall 323 defining the containment region 329. As can be seen in FIG. 10, the wall 323 forms a peripheral wall that defines the containment region 329 which contains the reticle 322. A set of reticle pin openings 350A sized to allow the reticle pins 330A-C are placed adjacent the wall 323. A second set of openings, namely resting pin openings, 350B are provided for the resting pins to fit therethrough. With a camera above the assembly, this design eliminates various openings in the prior art carrier base 218, which contributed to particle migration. With these camera openings eliminated and substantially reduced, particle migration is substantially reduced as well.

Figure 14:
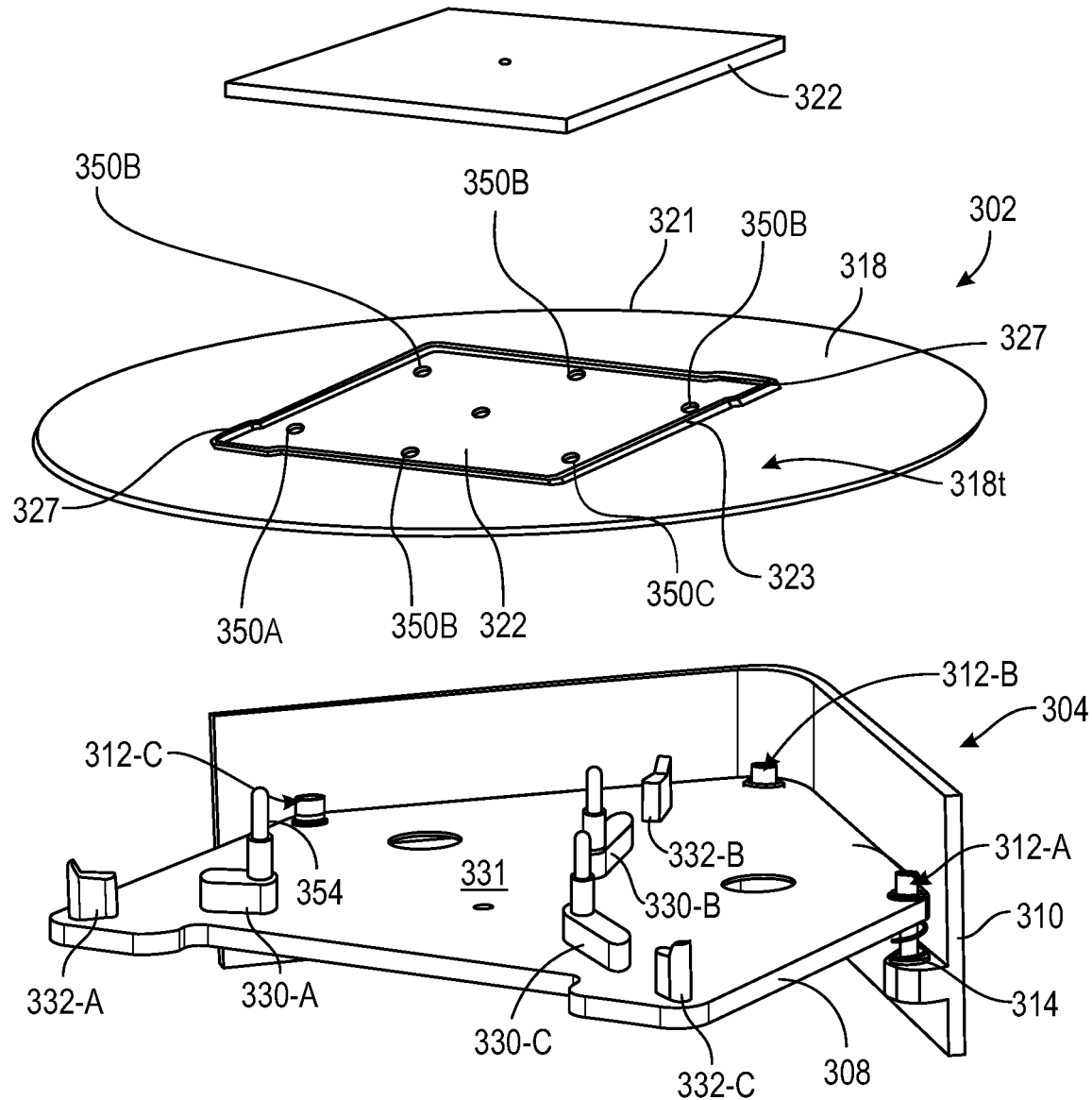
FIG. 14 an exploded perspective view of the reticle processing system according to an embodiment of the disclosure.
Figure 15:
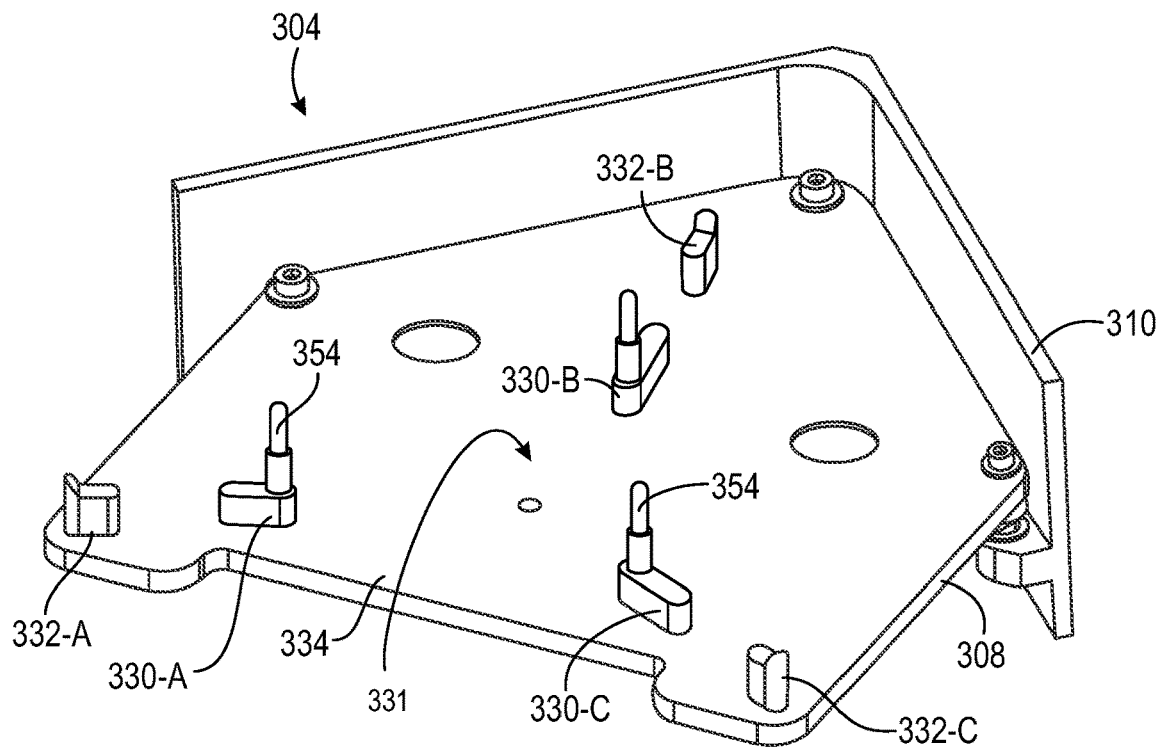
FIG. 15 is a perspective view of a support assembly of the reticle processing system of FIG. 14.
Figure 16:
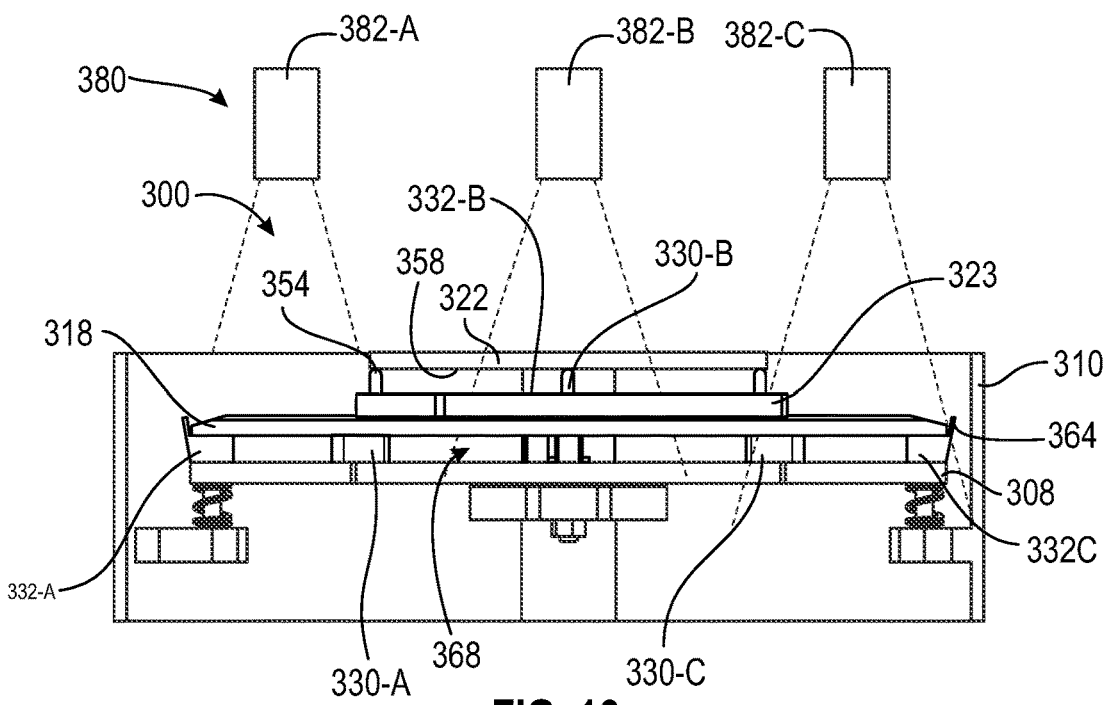
FIG. 16 is a side view of the reticle processing system of FIG. 14.

Referring to FIGS. 14-16, a reticle processing system 300 in use with carrier base 318 is shown according to one or more embodiments. As shown, the reticle processing system 300 (hereinafter "system") includes a carrier assembly 302 coupled to and supported by a support assembly 304. The support assembly 304 includes a plate 308 coupled to a frame 310 extending partially along a periphery of the plate 308. As shown, the plate 308 is coupled to the frame 310 by a set of fasteners 312A-C extending through openings of the frame 310. Although not limited to any particular type, the fasteners 312A-C may include nuts and bolts extending through the plate 308 and the frame 310, wherein a spring 314 is provided around the bolt to provide flexibility/resiliency to the fasteners 312A-C. As shown, the frame 310 has an L-shaped configuration and the plate 308 a hexagonal shape, thus permitting the support assembly 304 to be secured to a corner within a processing chamber. This configuration is non-limiting, as other geometries for the frame 310 and the plate 308 may be possible depending on the specific application and processing environment.

As shown, the carrier assembly 302 includes a carrier base 318 disposed below a reticle 322. One will see that compared to the prior art system, there is no carrier top shield. In one or more embodiments, the reticle 322 is an EUV mask blank having an ultra-low thermal expansion substrate of glass, silicon, or other ultra-low thermal expansion material. The ultra-low thermal expansion materials may include fused silica, fused quartz, calcium fluoride, silicon carbide, silicon oxide-titanium oxide alloy, or other material having a thermal coefficient of expansion within the range of these materials.

The plate 308 of the system 300 includes a set of reticle pins 330A-C, and a set of carrier base pins 332A-C, each extending vertically, or generally vertically, from a top surface 334 of the plate 308. The reticle pins 330A-C, and carrier base pins 332A-C are arranged in a pattern for supporting each component of the carrier base assembly 302, while minimizing the number of contact points between the plurality of pins and the carrier assembly.

During operation, the support assembly 304 receives the carrier assembly thereupon. As the carrier base 318 is lowered on the plate 308, the reticle pins 330A-C extend through a corresponding first set of openings 350A within the carrier base and engage the reticle 322. As shown, the reticle pins 330A-C generally extend vertically higher than the carrier base pins 332A-C. Each of the reticle pins 330A-C includes a domed upper face 354 engaging a bottom surface 358 of the reticle 322 to support the reticle 333 over the carrier base 318.

The plurality of reticle pins 330A-C, and carrier base pins 332A-C support the carrier base assembly 302 and the reticle so the carrier base 318 at a bottom surface 364 thereof, and the reticle 322, is supported and vertically separated from the carrier base 318. During use, when the carrier base assembly 302 is placed on the support assembly 304, the components of the carrier assembly are not in direct contact with one another. Specifically, the plurality of pins support the components of the carrier base assembly 302 in a way so the carrier base 318 is vertically separated from the plate 308 by a first gap 368, the reticle 322 is vertically separated from the carrier base 318 by a second gap 370. The placement and relative heights of the plurality of reticle pins 330A-C and the carrier base pins 332A-C, as well as the corresponding openings through the carrier base 318, enable the demonstrated separation between components of the carrier assembly 302 when positioned atop the support assembly 304.

As shown in FIG. 15, the system 300 may include a sensor system 380 configured to align the carrier assembly 302 to the support assembly 304. For example, one or more sensors 382A-C positioned are positioned above the support assembly 304 and used to verify whether each of the carrier base assembly components are correctly "in-position" on the support assembly 304. This also prevents a user from inadvertently placing the carrier base assembly 302 or reticle 322 on the support assembly 304 if one is already in position. The sensors may transmit an output/feedback to a processor (not shown) of the sensor system 280 for subsequent analysis/processing.

During operation, the sensor system 380 is used in conjunction with a robot (not shown), such as a factory interface (FI) robot, to accurately place the carrier base assembly 302, including the reticle 322, onto the support assembly 304, where the carrier base assembly 302 can be assembled or dis-assembled. Furthermore, the sensor system 380 positioned above the support assembly 304 is used to verify the carrier base assembly 302, including the reticle 322, are assembled correctly prior to being delivered to the loadlock. Advantageously, the robot is the sole moving component, ensuring the system 200 is not subject to unnecessary lifts or multiple robots, thus minimizing positional errors. For example, the vertical pick up and drop off trajectory of the robot is virtually identical, unlike when multiple, different lifts are employed.

As discussed above, and with reference to FIG. 8, which is a schematic view of a prior art carrier base 218 on a rotating pedestal 209 rotating about axis 217, it is very difficult to obtain flatness across the bottom surface 218b of the prior art carrier base 218, which results and friction (represented by arrows 211) between the pedestal and the bottom surface 218b of the carrier base 218 causing generation of particles 215 from deposited material 225 deposited in the gaps shown by arrows 213. The prior art carrier base 218 has multiple gaps and openings (e.g., openings 242A-C and openings 250A-D) which are source of migration of particles 215 from the pedestal 209 to top of the reticle 222 through these openings as shown by the arrows 213.

In specific embodiments, the resting pins 378 and the domed surfaces 379 comprise a material that dissipates static charge which prevents attraction of particles near the reticle 322. In some embodiments, the resting pins 378 and domed surfaces 379 are made from a carbon filled thermoplastic polymer. In some embodiments, the carbon filled thermoplastic polymer comprises 20-40% by weight carbon, for example 30% by weight carbon. In specific embodiments, the pins and domed surfaces are made from carbon filed polyetheretherketone (PEEK), for example 20-40% carbon filled PEEK, such as 30% carbon filled PEEK. PEEK is a high performance thermoplastic that is tough, strong, rigid, and creep resistant. It offers excellent thermal, chemical, and hydrolysis resistance as well as excellent resistance to abrasion and dynamic fatigue. Its ability to run at high continuous temperature (480° F.) without permanent property loss and stable electrical properties makes PEEK a good alternative to fluoropolymers in hostile environments. In some embodiments, In specific embodiments, 30% Carbon Filled PEEK has been reinforced with carbon fibers that improve PEEK's compressive strength and stiffness, while also reducing its expansion rate.

The reticle pins 230A-C are lifting pins are designed to create a gap between the carrier base 318 and the reticle 322 so that a robot arm can place and pick the reticle 322 during build of the carrier base assembly 302. The reticle pins 230A-C are made of the same or similar material as the resting pins 378 and domed surfaces 379.

Figure 17:
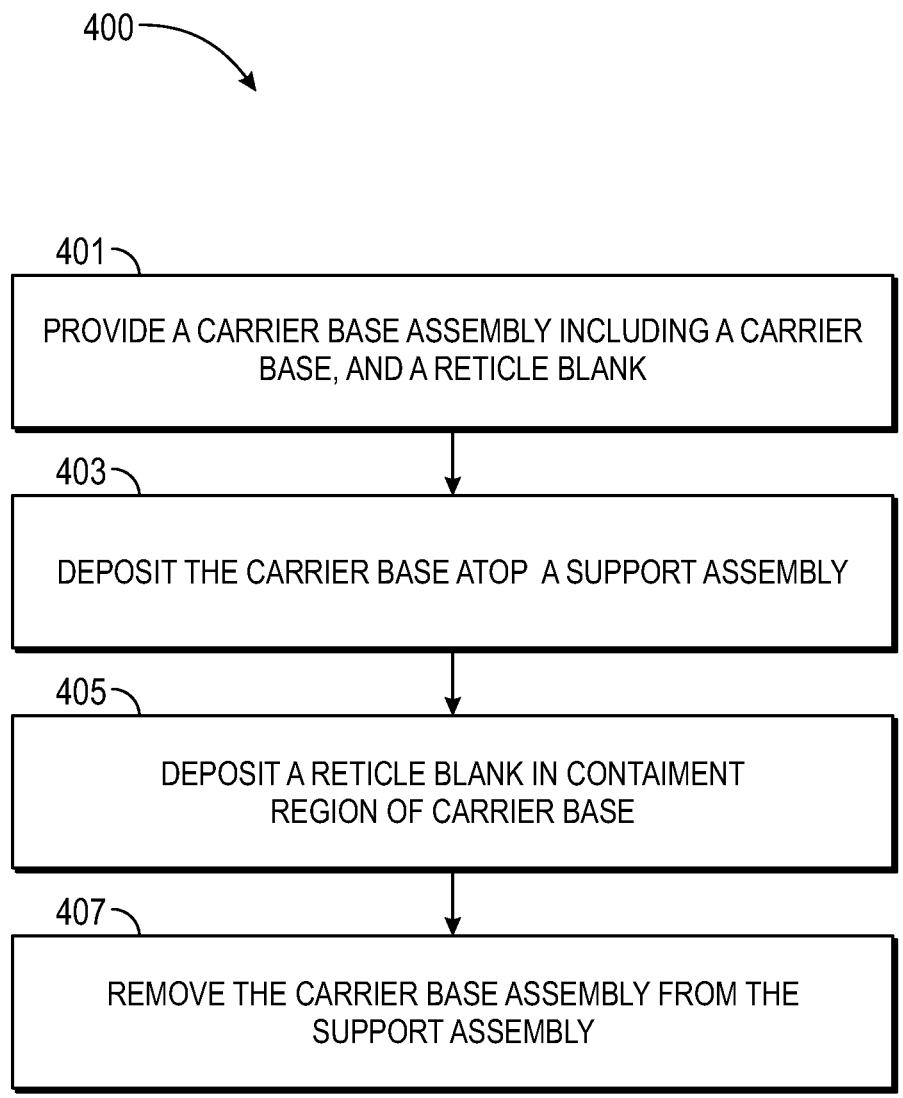
FIG. 17 is a flowchart illustrating an exemplary method for processing a reticle according to the present disclosure.

Turning now to FIG. 17, a flow diagram of a method for processing a reticle blank in accordance with certain aspects of the present disclosure is shown. In some embodiments, the methods may be implemented or instructed in part using a computer system. As such, the embodiments of the method may illustrate the functionality and/or operation of possible implementations of systems, methods, and computer program products according to various embodiments of the present disclosure. In this regard, the blocks in the flowchart may represent a module, segment, or portion of code, comprising one or more executable instructions for implementing the specified logical function(s). As also noted, in some alternative implementations, the functions noted in the blocks might occur out of the order depicted in the figures. For example, two blocks shown in succession may, in fact, be executed concurrently. As also noted, the blocks of the methods 400 can be implemented by special purpose hardware-based systems for performing the specified functions or acts, or combinations of special purpose hardware and computer instructions.

In one embodiment, as shown in FIG. 17 the method 400 may include providing a carrier base assembly consisting essentially of the carrier base as shown and described herein and a reticle blank, without a carrier top shield, as shown at block 401. The method 400 may further include depositing the carrier base atop a support assembly, as shown at block 403. In some embodiments, the support assembly includes a plate coupled to a frame. In some embodiments, the method 400 at block 403 includes depositing the carrier base assembly atop a plurality of pins extending from a top surface of the plate, wherein the plurality of pins support the carrier base assembly so the carrier base is vertically separated from the plate by a first gap, and the reticle blank is vertically separated from the carrier base by a second gap.

In some embodiments, the method 400 at block 403 may further include identifying a position of the carrier assembly using a sensor system positioned above the support assembly, and depositing the carrier base assembly atop the support assembly according to the identified position of the carrier assembly.

In some embodiments, the method 400 at block 403 may further include providing a set of reticle pins extending from the top surface of the plate through a first set of openings in the carrier base. The method 400 at block 403 further includes the set of reticle pins supporting the reticle over the carrier base. The method 400 at block 403 further includes providing a set of carrier base pins extending from the top surface of the plate, wherein the set of carrier base pins is in contact with the carrier base to support the carrier base over the plate. The set of carrier base pins and set of reticle pins are positioned adjacent a wall defining a containment region, the wall extending from a top surface of the carrier base, eliminating the need for a carrier top shield. The method 400 further includes depositing the reticle blank within a containment region of the carrier base defined by the wall as shown at block 405. In some embodiments, the reticle blank is deposited atop the set of reticle pins extending from the plate.

The method 400 further includes removing the carrier assembly from the support assembly, as shown at block 407. In some embodiments, a robot including a robot blade is positioned within the first gap formed between plate and the carrier base, and the carrier assembly is then lifted upwards from the support assembly, thus causing the carrier base, and the reticle blank to compress and engage one another. The robot may then transport the carrier base assembly for further processing. In some embodiments, the carrier base assembly is placed onto a pedestal of a physical deposition chamber, where one or more layers are deposited by physical vapor deposition onto the reticle.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "an embodiment" in various places throughout this specification are not necessarily referring to the same embodiment of the disclosure. Furthermore, the particular features, structures, materials, or characteristics may be combined in any suitable manner in one or more embodiments.

In further embodiments, the method step 401 shown in FIG. 17 includes a sequence of building a carrier base assembly which comprises orienting the carrier at an aligner station after it is picked up based on a position of notch. The carrier base is then inspected by a camera to check its orientation and placement. The carrier base and then moved to the system 300 described herein for assembly at 403. The reticle is then picked up and placed onto lifting pins by a separate robot blade (a reticle blade) as shown at 405. At 407, the carrier base blade picks up the entire assembly, which can be inspected at an inspection station prior to deposition, such as physical vapor deposition in a physical vapor deposition chamber.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A reticle processing system comprising:
a support assembly including a plate coupled to a frame;
a carrier base assembly configured to be positioned on the support assembly, the carrier base assembly comprising a carrier base comprising top surface and a wall extending from the carrier base defining a containment region, the containment region sized and shaped to contain an EUV reticle; and
resting pins extending from a bottom surface of the containment region configured to support the reticle at a distance away from the bottom surface of the carrier base, and the wall defines a height such that the wall has a top surface that extends above a top surface of the reticle when the EUV reticle is placed upon the resting pins.

2. The reticle processing system of claim 1, wherein the carrier base assembly does not include a carrier top shield configured to surround the reticle.

3. The reticle processing system of claim 2, further comprising a set of reticle pins extending from the top surface of the plate through openings in the carrier base, the set of reticle pins in contact with the reticle to support the reticle over the carrier base.

4. The reticle processing system of claim 2, further comprising a set of carrier base pins extending from the top surface of the plate, the set of carrier base pins configured to support the carrier base over the plate.

5. The reticle processing system of claim 1, wherein the resting pins comprise a domed surface which contacts a bottom surface of the reticle.

6. The reticle processing system of claim 5, wherein the resting pins, the domed surface and the reticle pins comprise a carbon filled PEEK material.

7. The reticle processing system of claim 1, further comprising a sensor system positioned above the support assembly and configured to align the carrier assembly to the support assembly.

8. A carrier base assembly comprising
 a carrier base comprising top surface and a wall extending from carrier base defining a containment region, the containment region sized and shaped to contain an EUV reticle;
 resting pins extending from a bottom surface of the containment region configured to support the reticle at a distance away from the bottom surface of the carrier base, and the wall defines a height such that the wall has a top surface that extends above a top surface of the reticle when the EUV reticle is placed upon the resting pins; and
 the EUV reticle contained within the containment region.

9. The carrier base assembly of claim 8, wherein the carrier base assembly does not include a top shield which surrounds the reticle.

10. The carrier base assembly of claim 9, wherein the resting pins comprise domed surfaces made from carbon filled PEEK material.

11. A method of processing an EUV reticle blank, the method comprising:
 providing a carrier base assembly including a carrier base and a reticle blank, the carrier base comprising top surface and a wall extending from carrier base defining a containment region, the containment region sized and shaped to contain the EUV reticle, the carrier base further including resting pins extending from a bottom surface of the containment region configured to support the reticle at a distance away from the bottom surface of the carrier base, and the wall defines a height such that the wall has a top surface that extends above a top surface of the reticle when the EUV reticle is placed upon the resting pins;
 placing the carrier base atop a support assembly, the support assembly including a plate coupled to a frame;
 depositing the reticle blank within containment region of the carrier base; and
 removing the carrier base assembly from the support assembly.

12. The method according to claim 11, further comprising depositing the carrier base assembly atop a plurality of pins extending from a top surface of the plate, the plurality of pins supporting the carrier assembly so the carrier base is vertically separated from the plate by a first gap, and the reticle blank is vertically separated from the carrier base by a second gap.

13. The method according to claim 12, further comprising:
 positioning a robot within the first gap; and
 lifting, using the robot, the carrier assembly from the support assembly to cause the carrier base and the reticle blank to engage one another.

14. The method according to claim 11, further comprising:
 identifying a position of the carrier base assembly using a sensor system positioned above the support assembly; and
 depositing the carrier base assembly atop the support assembly according to the identified position of the carrier base assembly.

15. The method according to claim 11, further comprising:
 placing the carrier base atop a set of reticle pins extending from the top surface of the plate through a set of openings in the carrier base, wherein the set of reticle pins supports the reticle over the carrier base; and
 placing the carrier base atop a set of carrier base pins extending from the top surface of the plate, wherein the set of carrier base pins supports the carrier base over the plate.

16. The method according to claim 15, further comprising moving the carrier base assembly from the support assembly to a physical vapor deposition chamber.

* * * * *

UNITED STATES PATENT AND TRADEMARK OFFICE
CERTIFICATE OF CORRECTION

| | | |
|---|---|---|
| PATENT NO. | : 11,940,724 B2 | Page 1 of 1 |
| APPLICATION NO. | : 17/110514 | |
| DATED | : March 26, 2024 | |
| INVENTOR(S) | : Sanjay Bhat et al. | |

It is certified that error appears in the above-identified patent and that said Letters Patent is hereby corrected as shown below:

In the Specification

• Column 7, Line 33, replace "3180." after "outer edge" with "318o.".

• Column 7, Line 43, replace "2180" after "edge" and before ". The" with "218o".

• Column 8, Line 17, add "." after "process" and before "Elimination".

Signed and Sealed this
Seventh Day of May, 2024

Katherine Kelly Vidal
*Director of the United States Patent and Trademark Office*